(12) United States Patent
Lloyd et al.

(10) Patent No.: US 7,104,803 B1
(45) Date of Patent: Sep. 12, 2006

(54) INTEGRATED CIRCUIT PACKAGE SOCKET AND SOCKET CONTACT

(75) Inventors: Shawn L. Lloyd, Tigard, OR (US); John G. Oldendorf, Portland, OR (US); J. Shelton Lewis, Hillsboro, OR (US); Michael Kochanowski, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/090,385

(22) Filed: Mar. 25, 2005

(51) Int. Cl.
*H01R 12/00* (2006.01)
*H01R 13/40* (2006.01)

(52) U.S. Cl. ........................................ 439/66; 439/591
(58) Field of Classification Search ................. 439/66, 439/591
See application file for complete search history.

(56) References Cited

U.S. PATENT DOCUMENTS

| | | | | |
|---|---|---|---|---|
| 5,380,210 A | * | 1/1995 | Grabbe et al. | 439/66 |
| 6,186,797 B1 | * | 2/2001 | Wang et al. | 439/66 |
| 6,604,950 B1 | * | 8/2003 | Maldonado et al. | 439/66 |
| 6,877,992 B1 | * | 4/2005 | Grant et al. | 439/66 |
| 6,921,270 B1 | * | 7/2005 | Mendenhall et al. | 439/66 |
| 6,945,788 B1 | * | 9/2005 | Trout et al. | 439/66 |
| 2002/0048973 A1 | * | 4/2002 | Zhou et al. | 439/66 |
| 2004/0253846 A1 | * | 12/2004 | Brown et al. | 439/66 |

* cited by examiner

*Primary Examiner*—Tho D. Ta
(74) *Attorney, Agent, or Firm*—Marger Johnson & McCollom P.C.

(57) ABSTRACT

An integrated circuit (IC) package socket is provided with an array of single-piece socket contact pins arranged to connect an IC package to a circuit board. The single-piece contact pin is supported at a middle portion of the contact pin and includes two acutely angled bends that allow the two ends of the contact pin to independently resiliently engage the package lands of the IC package and the contact pads of the circuit board. The contact pins are further shaped and arranged to laterally swipe the package lands and contact pads during engagement to scrape away or penetrate through any oxide or other contaminant buildup.

16 Claims, 5 Drawing Sheets

INTEGRATED CIRCUIT PACKAGE SOCKET AND SOCKET CONTACT

TECHNICAL FIELD

This disclosure relates to sockets that connect semiconductor packages to printed circuit boards and more specifically to the electrical contacts in the socket.

BACKGROUND

Connecting semiconductor packages to printed circuit boards (PCBs) has changed as the packages have become more highly integrated. Current types of package connector configurations include Ball Grid Array (BGA) and Land Grid Array (LGA) which spread the electrical connectors across the bottom surface of the package.

One solution for connecting the BGA and LGA packages to a PCB utilizes a socket arranged to receive and connect a package to a PCB contact pad. The package is inserted into the socket and contacts within the socket electrically connect the connectors on the bottom surface of the package to the contact pad of the PCB.

Sockets are generally appropriate for situations where packages are repeatedly inserted and replaced to and from a circuit board. An example of such use is a reference board used to showcase functional aspects of a chipset or processor in which different IC packages need to be quickly and effectively swapped out. Another example of socket use is in burn-in, testing and programming of IC packages during manufacturing. There, multiple sockets are mounted on a test board and IC packages are repeatedly inserted and tested as part of the IC package manufacturing process. And another example is the use of sockets on a motherboard allowing consumers to easily insert or replace IC packages.

Currently IC package sockets employ soldered contact pins or multi-piece contact pins. Both the soldered and multi-piece contact pins undesirably increase inductance and contact resistance between the package and the PCB. Further, installation and maintenance of soldered contact pins can add heat stress to the socket and to the PCB.

Some multi-piece contact pins use pressure and surface penetration methods with springs to establish a connection between the end of the contact and the package land or contact pad. Installation and maintenance of the multi-piece contact pins, however, requires the extra cost and time of multiple piece assembly.

Embodiments of the invention address these and other disadvantages in the prior art.

DETAILED DESCRIPTION

Figure 1:
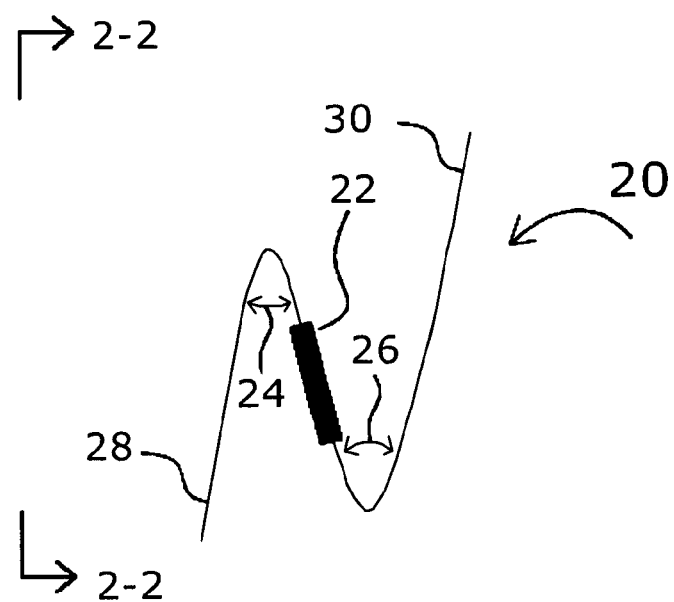
FIG. 1 is a side elevation view of a contact for use in an integrated circuit (IC) package socket according to an embodiment of the invention.

FIG. 1 shows a side elevation view of a contact pin 20 for use in an integrated circuit (IC) package socket (see FIGS. 3–4) according to an embodiment of the invention. Contact pin 20 may be formed from a single piece of conductive material. When the contact pin 20 is formed from a single piece of conductive material, it has a lower contact resistance and lower inductance than current multi-piece contact pins. The contact pin 20 may be made out of a conductive material and most preferably is made out of a conductive material that also has good spring qualities such a Beryllium Copper alloy or the like.

The contact pin 20 may include two acutely angled bends 24 and 26 positioned away from the middle portion 22. The acutely angled bends 24, 26 create resiliency in the first and second ends 28 and 30 when the contact pin 20 is stabilized at its middle portion 22. The first and second ends 28, 30 are sharply shaped to allow the ends 28, 30 to scrape through buildup on package lands and contact pads such as oxide and other contaminants when engaging the package lands and contact pads. This scraping aspect will be further described below with reference to FIGS. 6A–B.

Figure 2:
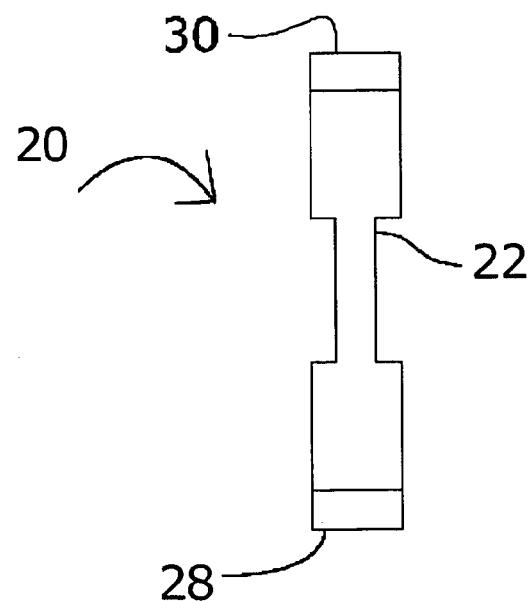
FIG. 2 is a side view of the contact of FIG. 1 taken along line 2—2 in FIG. 1.

FIG. 2 is a side view of the contact pin 20 of FIG. 1 taken along line 2—2. FIG. 2 shows the middle portion 22 notched for mounting in a socket. The notched middle portion 22 allows the contact pin 20 to be held in place thereby stabilizing the contact pin 20 at the middle portion 22 and allowing the first and second ends 28, 30 to be independently resilient because of the acutely angled bends 24 and 26.

Figure 3:
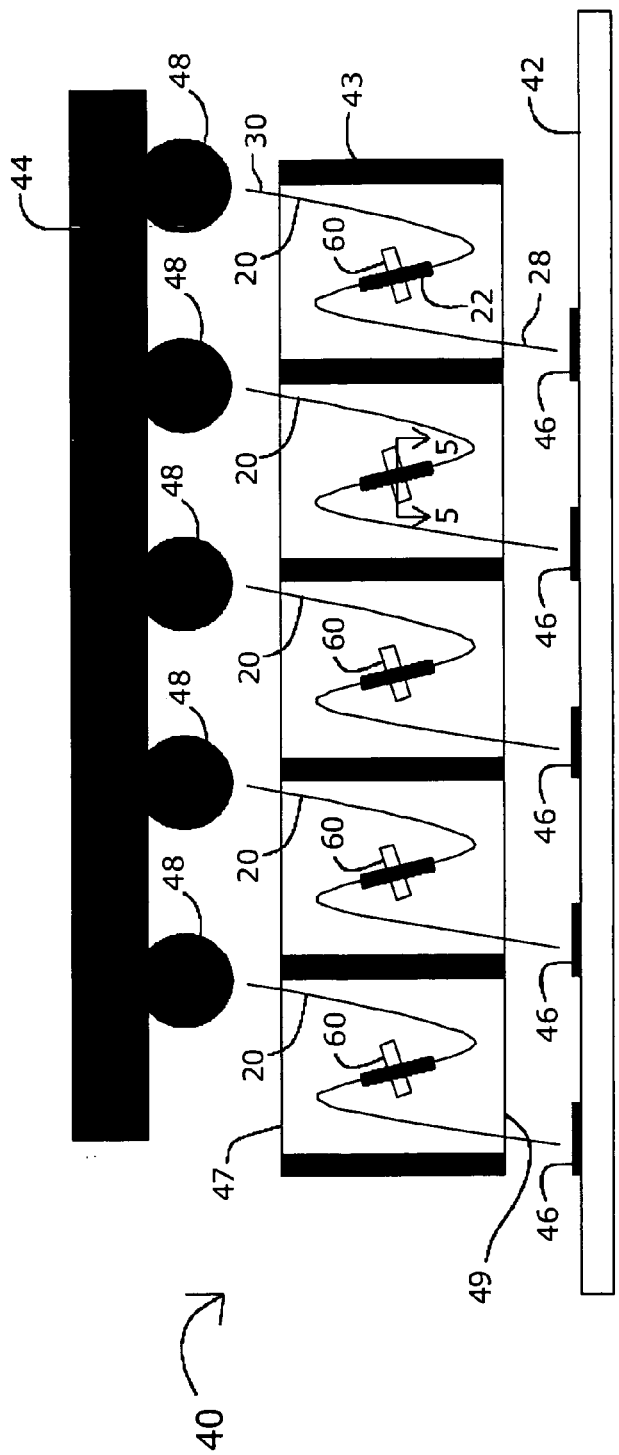
FIG. 3 is a side cross-sectional view of an IC package socket according to another embodiment of the invention showing the socket with a Ball Grid Array IC package and a circuit board.

FIG. 3 shows a side cross-sectional view of IC package socket 40 with an array of single-piece contact pins 20 mounted in the package receiving area 43 according to another embodiment of the invention. Referring to FIG. 3, the package receiving area 43 of socket 40 is shown with a package surface 47 below the Ball Grid Array (BGA) package 44 and an opposite contact pad surface 49 above the circuit board 42. First ends 28 of the contact pins 20 are oriented toward the contact pads 46 on the circuit board 42. Second ends 30 of the contact pins 20 are oriented toward the package ball lands 48 on the BGA package 44. Each contact pin 20 is mounted in the socket 40 at a middle portion 22 of the pin 20. The socket 40 stabilizes the middle portion 22 of each contact pin 20 thereby allowing the first and second ends 28, 30 to independently resiliently contact the circuit board 42 and BGA package 44.

Figure 5:
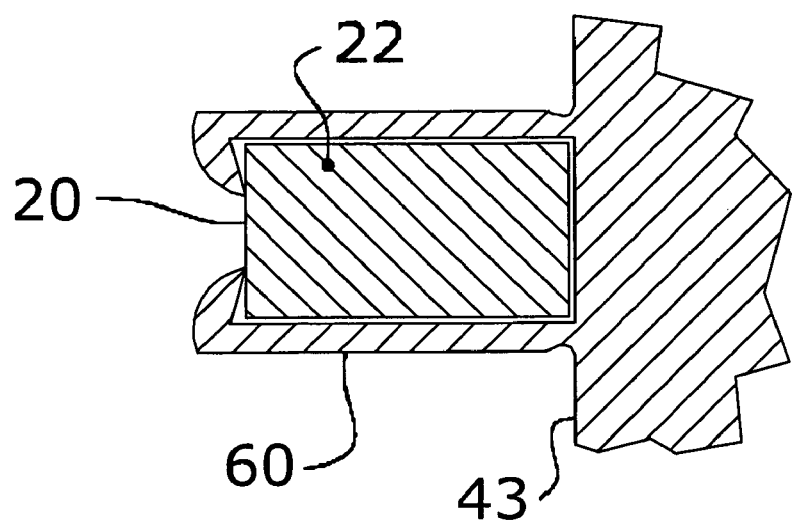
FIG. 5 is a cross-sectional view of the socket of FIG. 3 taken along line 5—5 in FIG. 3 showing the contact pin and contact pin support.

The contact pins 20 may be removably mounted on pin supports 60 for easy installation and individual replacement. FIG. 5 is a cross-sectional view of an embodiment of the pin support 60 holding the contact pin taken along line 5—5 in FIG. 3. In FIG. 5, the contact pin 20 is mounted on the pin support 60 at the middle portion 22 with a friction fit and lock. A person of reasonable skill in the art should recognize other mounting and/or support configurations for contact pin 20.

Figure 4:
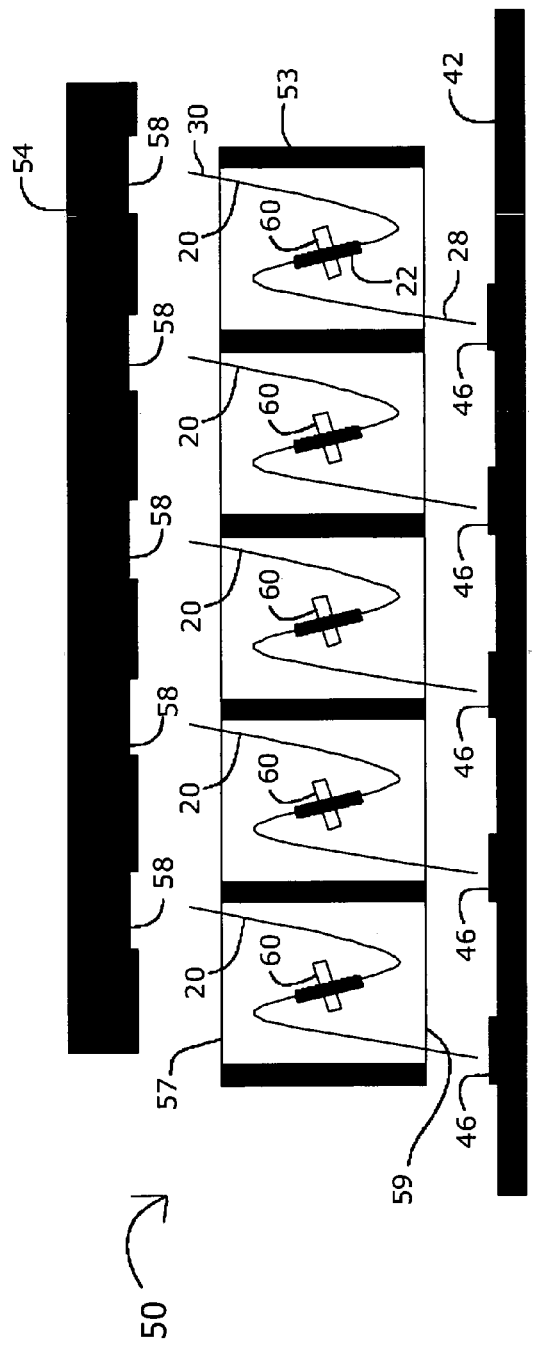
FIG. 4 is a side cross-sectional view of an IC package socket according to another embodiment of the invention showing the socket with a Land Grid Array IC package and a circuit board.

FIG. 4 shows a side cross-sectional view of IC package socket 50 arranged to receive a Land Grid Array (LGA) package 54. Referring to FIG. 4, the socket 50 includes package receiving area 53. An array of single-piece contact pins 20 is mounted in the receiving area 53. The package receiving area 53 of socket 50 is shown with a package surface 57 below the LGA package 54 and an opposite contact pad surface 59 above the circuit board 52. First ends 28 of the contact pins 20 are oriented toward the contact pads 56 on the circuit board 52. Second ends 30 of the contact pins 20 are oriented toward the package lands 58 on the LGA package 54. Each contact pin 20 is mounted in the socket 50 at a middle portion 22 of the pin 20. The socket 50 stabilizes the middle portion 22 of each contact pin 20 thereby allowing the first and second ends 28, 30 to independently resiliently contact the circuit board 52 and LGA package 54.

Figure 6A:
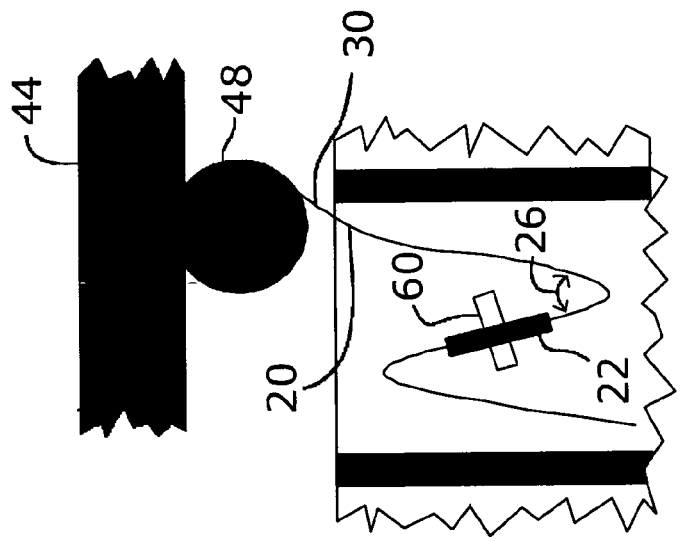
FIGS. 6A–B are detailed side cross-sectional views of the socket of FIG. 3 showing the contact pin swiping and engaging the BGA package land.
Figure 6B:
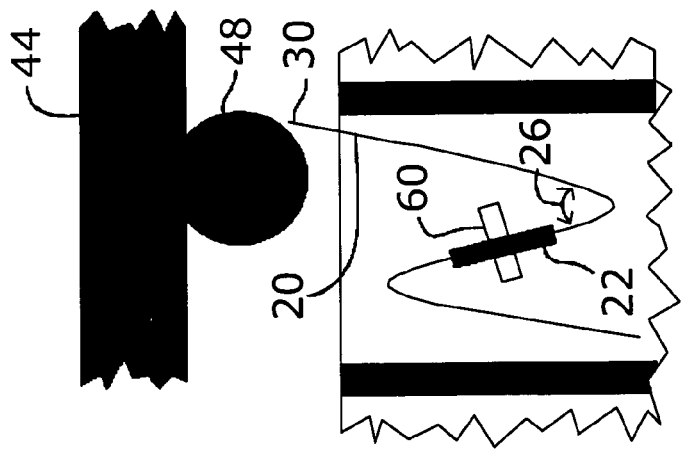

FIGS. 6A and 6B illustrate a second end 30 of a single-piece contact pin 20 engaging package land 48 of BGA package 44. As the BGA package 44 is lowered toward the contact pin 20, the contact pin 20 resiliently engages the package land 48 by bending open the acutely angled bend 26. As the second end 30 resiliently engages the package land 48, the sharply shaped second end 30 laterally swipes across the package land 48, scraping and penetrating through any oxide or other contaminant buildup on the package land 48. The lateral scraping of the package land 48 by the second end 30 ensures a good electrical connection between the BGA package 44 and the contact pin 20, and thereby with the circuit board 44 (shown in FIG. 3).

The same motion and engagement of the contact pin 20 occurs when a contact pin 20 engages an LGA package 54 and when the contact pin 20 engages a contact pad 46 on a circuit board 42. The arrangement of supporting the contact pin 20 at its middle portion 22 allows the first and second ends 28 and 30 to independently resiliently contact and laterally swipe the contact pads and package lands.

The sockets 40 and 50 shown in FIGS. 3 and 4 can be sockets arranged for performing burn-in, testing and programming of semiconductor packages. In that case, multiple sockets would be mounted on a single board and IC packages would be repeatedly installed and removed from the sockets.

The circuit board 42 shown in FIGS. 3 and 4 can be any kind of printed circuit board used in any one of numerous applications including a motherboard with the sockets arranged to receive a processor package.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

Although the specification may refer to "an" "one", "another", or "some" embodiment(s) in several locations, this does not necessarily mean that each such reference is to the same embodiment(s), or that the feature only applies to a single embodiment.

We claim:

1. An integrated circuit (IC) package socket, comprising:
    a package receiving portion including a package surface and an opposite contact pad surface; and
    an array of contact pins arranged in the package receiving portion where each contact pin is formed from a single piece of conductive material, each contact pin has a central mounting portion and first and second ends extending from the central mounting portion, where the first and second ends are independently resilient, where a first portion of the contact pin including the first end extends from the central mounting portion away from the package surface, around an acutely bent angle and then toward the package surface, and where a second portion of the contact pin including the second end extends away from the contact pad surface, around an acutely bent angle, and then toward the contact pad surface.

2. The socket of claim 1 where a contacting portion of the first and second ends of each contact pin are sharply shaped to penetrate oxide and contamination on a contact area of a package and contact pad.

3. The socket of claim 1 where the package receiving portion includes a Ball Grid Array package receiving structure.

4. The socket of claim 1 where the package receiving portion includes a Land Grid Array package receiving structure.

5. The socket of claim 1 comprising an array of support structures to support the array of contact pins.

6. The socket of claim 1 where the conductive material of each contact pin is a Beryllium Copper alloy.

7. The socket of claim 1 where the socket is mounted on a printed circuit board having corresponding contact pads.

8. The socket of claim 1 where the socket is a plurality of sockets mounted on a single board to perform one of burn-in, testing, and programming of IC packages.

9. The socket of claim 1 where the socket is mounted to a board.

10. A method of electrically connecting an integrated circuit (IC) package to a contact pad on a circuit board, comprising:
    mounting an array of contact pins in a socket;
    mounting the socket on the circuit board;
    contacting the contact pad on the circuit board with a sharp first end of each of the contact pins, laterally swiping the contact pad with the sharp first end of each contact pin; and
    contacting an array of package lands on the IC package with a sharp second end of each of the contact pins, laterally swiping each package land with the sharp second end of each corresponding contact pin;
    where the first end of a contact pin is independently resilient from the second end of the contact pin;
    where a first portion of one of the contact pins including the first sharp end extends from a central mounting portion away from the package land, around an acutely bent angle and then toward the package land; and
    where a second portion of the one contact pin including the second sharp end extends away from the contact pad, around an acutely bent angle, and then toward the contact pad.

11. The method of claim 10 where each of the contact pins is formed from a single piece of conductive material.

12. The method of claim 10 where mounting the array of contact pins in the socket includes removably mounting each contact pin to a pin support.

13. The method of claim 12 where removably mounting each contact pin to the pin support includes removably mounting a center potion of each contact pin to the pin support.

14. The method of claim 10 where mounting the socket on the circuit board includes mounting the socket on a printed circuit board.

15. The method of claim 10 comprising performing any one of burn-in, testing, and programming the IC package.

16. The method of claim 10 where mounting the socket on the circuit board includes mounting the socket on a motherboard.

* * * * *